United States Patent [19]
Bhandari et al.

[11] Patent Number: 6,099,653
[45] Date of Patent: Aug. 8, 2000

[54] LIQUID REAGENT DELIVERY SYSTEM WITH CONSTANT THERMAL LOADING OF VAPORIZER

[75] Inventors: Gautam Bhandari, Danbury; Thomas H. Baum, New Fairfield, both of Conn.

[73] Assignee: Advanced Technology Materials, Inc., Danbury, Conn.

[21] Appl. No.: 08/989,873

[22] Filed: Dec. 12, 1997

Related U.S. Application Data

[60] Provisional application No. 60/033,068, Dec. 12, 1996.

[51] Int. Cl.[7] .................................................. C23C 16/00
[52] U.S. Cl. .......................... 118/726; 261/142; 219/394
[58] Field of Search ............................ 261/142; 118/726, 118/715; 219/394

[56] References Cited

U.S. PATENT DOCUMENTS

| | | |
|---|---|---|
| 5,362,328 | 11/1994 | Gardiner et al. . |
| 5,536,323 | 7/1996 | Kirlin et al. . |
| 5,698,037 | 12/1997 | Stauffer ................................... 118/726 |
| 5,711,816 | 1/1998 | Kirlin et al. . |

*Primary Examiner*—Shrive Beck
*Assistant Examiner*—Sylvia R. MacArthur
*Attorney, Agent, or Firm*—Steven J. Hultquist; Oliver A. M. Zitzmann

[57] ABSTRACT

A liquid reagent delivery and vaporization system, including a housing defining a flow passage for flow of a process fluid therethrough. A vaporizer element is positioned within the housing and includes a heated vaporization surface. Liquid reagent is selectively delivered to the heated vaporization surface, to vaporize the liquid reagent and form reagent vapor for flow through the flow passage of the housing, e.g., to a chemical vapor deposition reactor for deposition of a film on a substrate. A thermal damping fluid source is arranged to selectively deliver a thermal damping fluid into the flow passage to maintain a predetermined thermal condition therein. For example, the system may be arranged to selectively terminate delivery of liquid reagent to the vaporization surface and to contemporaneously selectively initiate delivery of the thermal damping fluid into the flow passage to maintain a thermal condition thermally matches the vaporization conditions when the liquid reagent is vaporized. The use of a thermal damping fluid prevents the occurrence of undesired thermal gradients in the system when the system is cyclically operated to vaporize reagent liquid.

26 Claims, 5 Drawing Sheets

LIQUID REAGENT DELIVERY SYSTEM WITH CONSTANT THERMAL LOADING OF VAPORIZER

CROSS-REFERENCE TO RELATED APPLICATION

This application is based on and claims the priority of United States Provisional Patent Application 60/033,068 filed Dec. 12, 1996 in the names of Gautam Bhandari and Thomas H. Baum for "Liquid Reagent Delivery System with Constant Thermal Loading of Vaporizer".

BACKGROUND OF THE INVENTION

1. Field of the Invention

This invention relates generally to an apparatus and method for delivery and vaporization of a liquid reagent for transport to a deposition zone, e.g., a chemical vapor deposition (CVD) reactor.

2. Description of the Related Art

In the formation of thin films, layers and coatings on substrates, a wide variety of source materials have been employed. These source materials include reagents and precursor materials of widely varying types, and in various physical states. To achieve highly uniform thickness layers of a conformal character on the substrate, vapor phase deposition has been used widely as a technique. In vapor phase deposition, the source material may be of initially solid form which is sublimed or melted and vaporized to provide a desirable vapor phase source reagent. Alternatively, the reagent may be of normally liquid state, or may be in a liquid solution or suspension, which is vaporized, or the reagent may be in the vapor phase in the first instance.

In the manufacture of advanced thin film materials, a variety of reagents may be used. These reagents may be used in mixture with one another in a multicomponent fluid which is utilized to deposit a corresponding multicomponent or heterogeneous film material. Such advanced thin film materials are increasingly important in the manufacture of microelectronic devices and in the emerging field of nanotechnology. For such applications and their implementation in high volume commercial manufacturing processes, it is essential that the film morphology, composition, and stoichiometry be closely controllable. This in turn requires highly reliable and efficient means and methods for delivery of source reagents to the locus of film formation.

Examples of advanced thin film materials include refractory materials such as high temperature superconducting (HTSC) materials including $YBa_2Cu_3O_x$, wherein x is from about 6 to 7.3, BiSrCaCuO, and TlBaCaCuO. Barium titanate, $BaTiO_3$, and barium strontium titanate ("BST"), $Ba_xSr_{1-x}TiO_3$, have been identified as ferroelectric and photonic materials with unique and potentially very useful properties in thin film applications of such materials. $Ba_xSr_{1-x}Nb_2O_6$ is a photonic material whose index of refraction changes as a function of electric field and also as a function of the intensity of light upon it. Lead zirconate titanate, $PbZr_{1-x}Ti_xO_3$, is a ferroelectric material whose properties are very interesting. The Group II metal fluorides, $BaF_2$, $CaF_2$, and $SrF_2$, are useful for scintillation detecting and coating of optical fibers. Refractory oxides such as $Ta_2O_5$ are coming into expanded use in the microelectronics industry; $Ta_2O_5$ is envisioned as a thin-film capacitor material whose use may enable higher density memory devices to be fabricated.

Thin films comprising the Group II metal fluorides, $BaF_2$, $CaF_2$, and $SrF_2$, are potentially very useful as buffer layers for interfacing between silicon substrates and HTSC or GaAs overlayers or between GaAs substrates and HTSC or silicon overlayers, and combinations of two or all of such metal fluorides may be employed in forming graded compositions in interlayers providing close lattice matching at the interfaces with the substrate and overlayer constituents of the composite. For example, a silicon substrate could be coated with an epitaxial layer of $BaF_2/CaF_2$, $SrF_2/CaF_2$, or $SrF_2/CaF_2/BaF_2$, whose composition is tailored for a close lattic to the silicon. If the ratio of the respective Group II metal species in the metal fluoride interlayers can be controlled precisely in the growth of the interlayer, the lattice constant could be graded to approach the lattice constant of GaAs. Thus, a gallium arsenide epitaxial layer could be grown over the metal fluoride interlayer, allowing the production of integrated GaAs devices on widely available, high quality silicon substrates. Another potential use of such type of metal fluoride interlayers would be as buffers between silicon substrates and polycrystalline HTSC films for applications such as non-equilibrium infrared detectors. Such an interlayer would permit the HTSC to be used in monolithic integrated circuits on silicon substrates.

$BaTiO_3$ and $Ba_xSr_{1-x}Nb_2O_6$ in film or epitaxial layer form are useful in photonic applications such as optical switching, holographic memory storage, and sensors. In these applications, the $BaTiO_3$ or $Ba_xSr_{1-x}Nb_2O_6$ film is the active element. The related ferroelectric material $PbZr_{1-x}Ti_xO_3$ is potentially useful in infrared detectors and thin film capacitors well as filters and phase shifters.

Chemical vapor deposition (CVD) is a particularly attractive method for forming thin film materials of the aforementioned types, because it is readily scaled up to production runs and because the electronic industry has a wide experience and an established equipment base in the use of CVD technology which can be applied to new CVD processes. In general, the control of key variables such as stoichiometry and film thickness, and the coating of a wide variety of substrate geometries is possible with CVD. Forming the thin films by CVD permits the integration of these materials into existing device production technologies. CVD also permits the formation of layers of the refractory materials that are epitaxially related to substrates having close crystal structures.

CVD requires that the element source reagents, i.e., the precursor compounds and complexes containing the elements or components of interest must be sufficiently volatile to permit gas phase transport into the chemical vapor deposition reactor. The elemental component source reagent must decompose in the CVD reactor to deposit only the desired element at the desired growth temperatures. Premature gas phase reactions leading to particulate formation must not occur, nor should the source reagent decompose in the lines before reaching the reactor deposition chamber. When compounds are desired to be deposited, obtaining optimal properties requires close control of stoichiometry which can be achieved if the reagent can be delivered into the reactor in a controllable fashion. In this respect the reagents must not be so chemically stable that they are non-reactive in the deposition chamber.

Desirable CVD reagents therefore are fairly reactive and volatile. Unfortunately, for many of the refractive materials described above, volatile reagents do not exist. Many potentially highly useful refractory materials have in common that one or more of their components are elements, i.e., the Group II metals barium, calcium, or strontium, or the early transition metals zirconium or hafnium, for which no or few volatile compounds well-suited for CVD are known. In many cases, the source reagents are solids whose sublimation temperature may be very close to the decomposition temperature, in which case the reagent may begin to decompose in the lines before reaching the reactor, and it therefore is very difficult to control the stoichiometry of the deposited films from such decomposition—susceptible reagents.

When the film being deposited by CVD is a multicomponent substance rather than a pure element, such as barium titanate or the oxide superconductors, controlling the stoichiometry of the film is critical to obtaining the desired film properties. In the deposition of such materials, which may form films with a wide range of stoichiometries, the controlled delivery of known proportions of the source reagents into the CVD reactor chamber is essential.

In other cases, the CVD reagents are liquids, but their delivery into the CVD reactor in the vapor phase has proven difficult because of problems of premature decomposition or stoichiometry control. Examples include the deposition of tantalum oxide from the liquid source tantalum ethoxide and the deposition of titanium nitride from bis(dialkylamide) titanium reagents.

In recent years, the liquid delivery technique has come into increasingly widespread use, for chemical vapor deposition applications using "problematic" reagents such as those described above. In the liquid delivery approach, the reagent composition is dissolved or suspended in a suitable solvent medium, and the liquid is subjected to rapid vaporization to produce a precursor vapor which then is transported to the chemical vapor deposition chamber, optionally augmented by a carrier gas, e.g., an inert gas or an oxidant medium, to be contacted with the substrate heated to appropriate temperature. The liquid delivery technique has come into increasingly widespread use, and continues to evolve as a thin film materials fabrication methodology.

While source reagent liquid delivery systems present distinct advantages over conventional techniques, there is often some fraction of the precursor compound that decomposes into very low volatility compounds that remain at the vaporization zone. This deficiency is an important issue in the operation of CVD processes that use thermally unstable solid source precursors which undergo significant decomposition at conditions needed for sublimation. Such decomposition can occur in all reagent delivery systems that involve a vaporization step, including flash vaporizer liquid delivery systems as well as more conventional reagent delivery systems that include bubblers and heated vessels operated without carrier gas.

Although well-behaved CVD precursors vaporized under "ideal" conditions will form no deposits or residue at the vaporization zone, deviations from this situation are common and can be divided into several categories:

1) Reactive impurities in either the precursor or in the carrier gas decompose at the vaporizer temperatures.

2) Spatial and temporal temperature variations occur in the vaporization zone, with temperatures in some regions being sufficient to bring about decomposition.

3) CVD precursors are employed which are thermally unstable at the sublimation temperature.

Optimization of the conditions used in the vaporizer of reagent delivery systems can minimize the fraction of the delivered precursor that decomposes (and remains) at the vaporization zone, but virtually all solid and liquid precursors undergo some decomposition when they are heated for conversion to the gas phase, although this fraction is negligibly small in "well-behaved" compounds. Use of precursors that tend to decompose near their vaporization temperature may be mandated by availability (i.e., where the selected precursor possesses the best properties of available choices) or by economics, where precursor cost is strongly dependent on the complexity of its synthesis.

Additionally, CVD precursors often contain impurities, and the presence of those impurities can cause undesirable thermally activated chemical reactions at the vaporization zone, also resulting in formation of involatile solids and liquids at that location. For example, a variety of CVD precursors (such as tantalum pentaethoxide) are water-sensitive and hydrolysis can occur at the heated vaporizer zone forming tantalum oxide particulates that may be incorporated into the growing tantalum oxide film with deleterious effects.

Despite the advantages of the liquid delivery approach (which include improved precision and accuracy for most liquid and solid CVD precursors and higher delivery rates), the foregoing deficiencies pose a serious impediment to widespread use of the vaporization liquid delivery technique for providing volatilized reagent to the CVD reactor.

Improved liquid delivery systems are disclosed in U.S. Pat. No. 5,204,314 issued Apr. 20, 1993 to Peter S. Kirlin et al. and U.S. Pat. No. 5,536,323 issued Jul. 16, 1996 to Peter S. Kirlin et al., which describe heated foraminous vaporizer elements such as microporous disk elements, frits, screens, meshes, grids, porous sintered matrices, and other high surface area elements onto which the liquid solution or suspension is introduced for vaporization thereof. These heated foraminous vaporizer elements may be composed of various materials including ceramic, glass or metal and serve to carry out the rapid vaporization step. In use, liquid source reagent compositions are flowed onto the foraminous vaporizer element for flash vaporization thereof. Vapor thereby is produced for transport to the deposition zone, e.g., a CVD reactor. The liquid delivery systems of these patents provide high efficiency generation of vapor from which films may be grown on substrates. Such liquid delivery systems are also usefully employed for generation of multicomponent vapors from corresponding liquid reagent solutions containing one or more precursors as solutes, or alternatively from liquid reagent suspensions containing one or more precursors as suspended species.

The art continues to seek improvements in liquid delivery systems for vapor-phase formation of advanced materials, as well as improvements in ancillary equipment such as fluid transport, vaporizer, mixing, and control means associated with the liquid delivery system, and process conditions and techniques for operating the liquid delivery system and ancillary equipment in a maximally efficient manner.

One area in which improvement is sought relates to the time-varying thermal loading of the vaporizer in the liquid delivery system.

This variation is due to the fact that in a manufacturing environment the continuous flow of reagent(s) through the vaporizer, be it a liquid delivery system with a vaporizer element for volatilizing liquid source reagents contacted with the vaporizer element, or a conventional bubbler-based reagent vaporization system, in the absence of deposition downstream is not desirable. A reagent on/off sequence is advantageous both economically and environmentally in the liquid delivery system, with the reagent thereby being cyclically fed to the vaporizer element. Such reagent on/off sequence, however results in cooling and heating cycles occurring in the vaporizer, which upset the thermal gradients established in the vaporizer during its operation. This, in turn, adversely affects the reproducibility of the films deposited in the downstream chemical vapor deposition chamber.

It would therefore be a significant advance in the art of liquid delivery reagent vaporization systems, and is an object of the present invention, to provide an effective means of delivering a reagent liquid in vapor form to a chemical vapor deposition process with minimal formation of deposits and residue.

It is another objective of the present invention to provide a vaporizer arrangement which is not adversely affected by periodic feeding of source reagent liquid to the vaporizer element of the liquid delivery system.

It is a still further objective of the present invention to provide a liquid delivery reagent vaporization system having a periodic feeding of source liquid reagent to a vaporizer element without adversely affecting the thermal gradients established in the vaporizer during its operation.

Other objects and advantages of the invention will be more fully apparent from the ensuring disclosure and appended claims.

SUMMARY OF THE INVENTION

The present invention relates to a liquid reagent delivery and vaporization system and process for the provision of vaporized reagent for subsequent processing thereof.

In a broad apparatus aspect, the present invention relates to a liquid reagent delivery and vaporization system, comprising:

a housing defining a flow passage for flow of a process fluid therethrough;

a vaporizer element positioned within the housing and including a vaporization surface;

means for heating the vaporization surface of the vaporizer element;

a liquid reagent source arranged to selectively deliver a liquid reagent to the vaporization surface of the vaporizer element during heating thereof, so that the liquid reagent is vaporized to form a reagent vapor for flow through the flow passage; and a thermal damping fluid source arranged to selectively deliver a thermal damping fluid into the flow passage to maintain a predetermined thermal condition therein.

In one specific apparatus aspect, the invention relates to a liquid reagent delivery and vaporization system including a vaporizer element in a housing defining a flow passage for flow of vapor from the vaporizer element (e.g., to a chemical deposition vaporization chamber arranged in vapor-receiving relationship to the liquid reagent delivery and vaporization system). A supply of liquid reagent is arranged to periodically flow liquid to the vaporizer element to vaporize the liquid at the vaporizer element and produce a reagent vapor. The liquid reagent may comprise a liquid-phase precursor compound or complex, or the precursor composition alternatively may be a liquid solution or suspension containing a solubilized or suspended solid-phase precursor compound or complex, or a liquid precursor may be provided in a liquid carrier medium as a solution or suspension.

The improvement of the present invention comprises flowing a thermal damping fluid through the flow passage of the liquid delivery system, during the time that liquid reagent is not flowed to the vaporizer element, to thermally damp the vaporizer element and maintain an enhanced uniformity of thermal load on the vaporizer element during liquid reagent flow to the vaporizer element and during flow of thermal damping fluid through the flow passage of the liquid delivery system. Alternatively, the thermal damping fluid may be delivered directly to the vaporization surface of the vaporizer element, to thermally damp the vaporizer element.

The thermal damping fluid may be an inert gas such as He, Ar, $N_2$, etc. at an elevated temperature and at a suitable flow rate so that a constant thermal gradient is continuously maintained in the vaporizer. The thermal damping fluid may also comprise solvent vapor, such as the vapor of a solvent which also is used as the solvent medium for the source reagent compound or complex introduced to the vaporizer element in the normal on-stream operation of the system for delivering reagent vapor to the downstream vapor deposition zone. Alternatively, the damping fluid may be a solvent other than that which may be employed for solubilization or suspension of the reagent compound or complex. The thermal damping fluid may also comprise a liquid solvent delivered directly to the vaporization surface. Flow rate and temperature of the thermal damping fluid are variables that can be modified iteratively (through a feed-back loop) or fixed so that the thermal environment in the vaporization zone during the introduction of the thermal damping fluid substantially matches the condition of thermal equilibrium in the vaporizer when the vaporizer element is receiving liquid reagent.

Alternatively, the thermal damping fluid may be a low cost flush liquid or liquid mixture selected such that its thermal characteristics (boiling point, vapor pressure, latent heat of vaporization) closely match those of the liquid reagent in use. In addition to the choice of solvents, the flow rate of this thermal damping fluid can be adjusted to match the thermal characteristics of the reagent(s) in use. These fluids may have the added benefit of flushing the vaporizer assembly.

In one specific aspect, the present invention relates to a liquid reagent delivery and vaporization system wherein reagent liquid is periodically and cyclically flowed to a vaporizer element in a housing for generation of reagent vapor, e.g., for chemical vapor deposition, and wherein a thermal damping fluid is flowed into the housing and contacted with the vaporizer element therein, to thermally match the thermal load on the housing and vaporizer element during the period of time that the housing and vaporizer element are not receiving liquid reagent. The thermal damping fluid may be a gas which is heated to appropriate temperature for minimization of thermal gradients in the system, or alternatively the thermal damping fluid may comprise a vaporizable liquid whose thermal vaporization characteristics provide the desired thermal match in the system during the period of time that the system is not receiving the liquid reagent.

In a broad method aspect, the invention relates to a liquid reagent delivery and vaporization process, comprising:

providing a housing defining a flow passage for flow of a process fluid therethrough, with a vaporizer element within the housing and including a vaporization surface;

heating the vaporization surface of the vaporizer element;

selectively delivering a liquid reagent to the vaporization surface of the vaporizer element during heating thereof, so that the liquid reagent is vaporized to form a reagent vapor;

flowing the reagent vapor through the flow passage; and selectively deliver a thermal damping fluid into the flow passage to maintain a predetermined thermal condition therein.

In one specific method aspect, the present invention relates to a liquid delivery and vaporization process including vaporization of a liquid reagent in a liquid reagent vaporization zone to produce a reagent vapor for subsequent vapor processing, e.g., deposition of component(s) of the reagent vapor on the substrate. The improvement of the invention in this process aspect of the invention relates to flowing a thermal damping fluid through the vaporization zone during the time that liquid reagent is not being vaporized for subsequent deposition of vapor component(s) on a substrate, in order to reduce variation in thermal condition of the vaporization zone. The thermal damping fluid may therefore be flowed through the vaporization zone in sufficient quantity and at sufficient rate to substantially thermally match the thermal conditions in the vaporization zone during the time that liquid reagent is being vaporized for subsequent deposition of vapor component(s) on the substrate.

The thermal damping fluid may as described hereinabove comprise an inert gas at appropriate elevated temperature for matching the temperature of the vaporization zone during the preceding liquid reagent vaporization, so that thermal gradient variation during overall operation in the vaporization zone is minimized.

Alternatively, the thermal damping fluid may be a vaporizable liquid whose vaporization in the vaporization zone "thermally matches" the vaporization of the reagent liquid in the vaporization zone.

It will be recognized that the use of a thermal damping fluid in the manner of the present invention achieves a substantial reduction in variation of temperature of the vaporizer element and other structural/components of the liquid delivery system along the housing flow path of the vapor therein, over the full period of operation of the vaporizer, i.e., during "normal" liquid reagent flow to the vaporizer element, as well as during "off-periods" when liquid reagent is not being actively furnished to the vaporizer element. The invention enables the vaporizer to be operated in a time-efficient manner without the need for flushing with expensive reagent to achieve thermal equilibrium.

Other aspects and features of the invention will be more fully apparent from the ensuring disclosure and appended claims.

DETAILED DESCRIPTION OF THE INVENTION, AND PREFERRED EMBODIMENTS THEREOF

Figure 1:
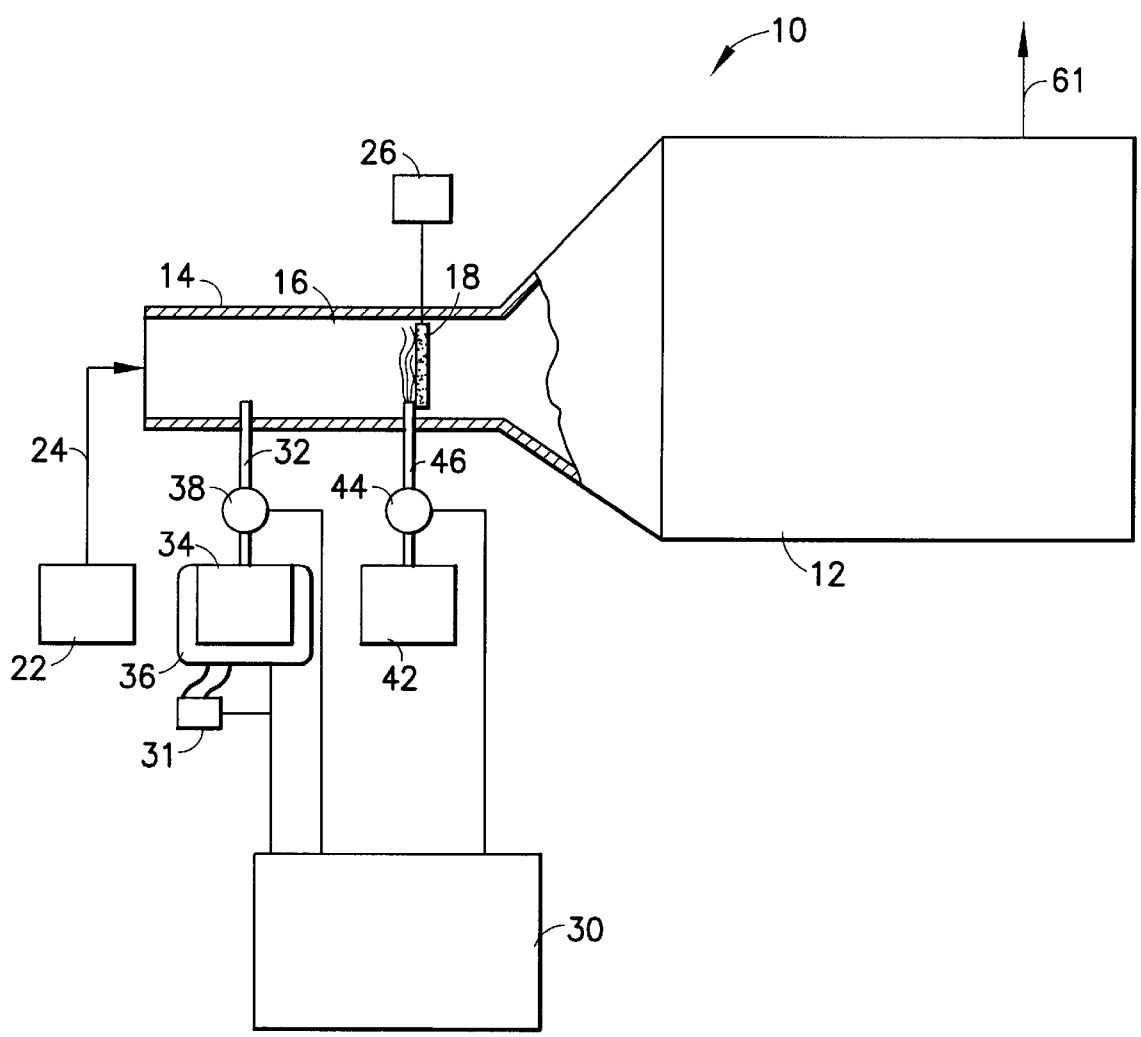
FIG. 1 is a schematic representation of a liquid reagent delivery system for vaporization of reagent liquid and transport of the resulting reagent vapor to a chemical vapor deposition chamber, with provision for "off-line" feeding of thermal damping fluid to the liquid reagent delivery system, during the period of operation that liquid reagent is not being fed to the liquid reagent delivery system.

Referring now to the drawings, FIG. 1 is a schematic representation of a liquid reagent delivery and vaporization system 10 according to one embodiment of the present invention.

In this system a reagent reservoir 42 containing liquid reagent is joined in flow communication, by liquid reagent line 46 containing flow control valve 44, with a housing 14 of the liquid reagent delivery and vaporization system 10. The housing 14 defines a flow passage 16 therein containing a vaporizer element 18.

As discussed, the liquid reagent may comprise a liquid-phase precursor compound or complex, or the precursor composition alternatively may be a liquid solution or suspension containing a solubilized or suspended solid-phase precursor compound or complex, or a liquid precursor may be provided in a liquid carrier medium as a solution or suspension therewith.

The vaporizer housing 14 may also receive oxidant or inert carrier gas in carrier gas line 24 from a suitable source 22 of same. The vaporizer element 18 may be constructed and arranged in any suitable manner, to vaporize the liquid reagent and form reagent vapor. In the embodiment shown, the vaporizer element 18 comprises a porous sintered metal disk having appropriate pore size and porosity so that liquid from liquid reagent line 46 issuing onto the disk is rapidly spread across its surface by capillary action, and vaporized.

The vaporizer element 18 in the embodiment shown is heated by heater 26 operatively coupled therewith and selectively actuatable to heat the vaporizer element to a temperature suitable for the vaporization of the liquid reagent. Alternatively, the vaporizer element could be of any alternative form, e.g., a mesh, grid, screen, plate, array of rods, or other elements presenting surface(s) on which the reagent liquid may be distributed an vaporized.

The vaporizer element likewise may be heated in any suitable manner, e.g., by conductive heating, electrical resistance heating, radiative heating (e.g., by an infrared lamp positioned exteriorly of the housing and arranged to impinge IR radiation onto the vaporizer element), or convective heat transfer. The vaporizer element may even be configured as a heat exchanger body, containing interior heat transfer fluid flow passages, through which a heat transfer medium is flowed to heat the vaporizer element surfaces to appropriate temperature to effect vaporization of the reagent liquid.

The resulting reagent vapor, augmented with any oxidant or carrier gas to form a reagent vapor stream, flows from flow passage 16 to the chemical vapor deposition (CVD) chamber 12, in which deposit of the deposition species on a substrate is carried out in a conventional manner to form a desired thin film on the substrate. Thus, the CVD chamber may be provided with a susceptor or other mounting structure for positioning of a substrate element, e.g., a semiconductor wafer, thereon, and heating the substrate element to sufficient temperature to accommodate the deposition operation. Effluent gas is discharged from the CVD chamber 12 in discharge line 61 and may be passed to further processing or disposition.

The liquid reagent flow control valve 44 in line 46 is joined in control relationship by a signal transmission line to a cycle time controller 30 which may comprise suitable CPU, microprocessor, and/or other control means by which flow control valve 44 is operated according to a selected cycle during which the flow control valve 44 is open for a portion of the cycle and during which control valve 44 is closed for a remaining portion of the cycle, following which the flow control valve 44 is reopened, and so on.

The vaporizer housing 14 is joined in flow communication by thermal damping fluid line 32 to a source vessel 34 of thermal damping fluid, and a heater jacket 36, connected to power source 31, surrounds thermal damping fluid source vessel 34, to effect heating of the thermal damping fluid therein, if required, to thermally damp the vaporizer element 18 in the housing 14. For example, source vessel 34 may comprise a high pressure gas cylinder which is heated by means of heater jacket 36 so that gas is dispensed therefrom to thermal damping fluid line 32 for flow to the flow passage 16 in the housing 14. The fluid line 32 is provided with a damping fluid flow control valve 38 therein, coupled by a signal transmission line to the cycle time controller 30, so that the cycle time controller 30 closes flow control valve 38 when the liquid reagent flow control valve 44 is opened by the controller 30 and so that the cycle time controller 30 opens flow control valve 38 when flow control valve 44 is closed by the controller 30.

In this manner, the housing 14 containing vaporizer element 18 continuously receives therewithin liquid reagent (during active "on stream" vaporization operation, during which the reagent liquid is vaporized at the vaporizer element) or thermal damping fluid (during the time that no reagent liquid is being fed to the liquid delivery system housing and vaporizer element).

The temperature and flow rate of the thermal damping fluid are selectively controlled by the heating jacket 36 and flow control valve 38, respectively, to thermally match the condition of the housing 14, flow passage 16 and vaporizer element 18 during active on-stream vaporization operation, so that a substantially uniform thermal load is placed on vaporizer element 18 and housing 14 internal structure, throughout the entire period of operation including active deposition processing as well as the "off-line" time that no reagent is being flowed to the vaporizer element.

Alternatively, the thermal damping fluid in the source vessel 34 may comprise a vaporizable liquid whose thermal and vaporization characteristics are such that vaporization of the thermal damping fluid maintains a substantially uniform thermal load on vaporizer element 18 and housing 14 internal structure, throughout the entire period of operation. For this purpose, the thermal damping fluid may be selected as a single component liquid or alternatively, as a multi-component liquid, whose temperature, pressure, flow rate, specific heat capacity, heat of vaporization, and vaporization temperature, are selected to possess comparable physical properties to those physical properties of the liquid reagent or provide the described thermal match to the normal on-stream vaporization of the liquid reagent. As used herein, the term "comparable" means that physical properties values of specific heat, heat of vaporization, and vaporization temperature are each within fifty percent (50%) of the same physical properties of the liquid reagent, preferably being within twenty five percent (25%), more preferably within fifteen percent (15%) and most preferably within ten percent (10%).

As mentioned, the thermal damping medium may also comprise a fluid including solvent vapor, such as the vapor of a solvent which also is used as the solvent medium for the source reagent compound or complex introduced to the vaporizer element in the normal on-stream operation of the system for delivering reagent vapor to the downstream vapor deposition zone, or it may comprise a different solvent from that employed for solubilization or suspension of the reagent compound or complex.

The improvement of the present invention comprises flowing the thermal damping fluid through the flow passage or to the surface of the vaporizer element of the liquid delivery system, during the time that liquid reagent is not flowed to the vaporizer element, to thermally damp the vaporizer element and maintain an enhanced uniformity of thermal load on the vaporizer element during liquid reagent flow to the vaporizer element and during flow of thermal damping fluid.

As a specific example, the thermal damping fluid may be an inert gas such as He, Ar, $N_2$, etc. at an elevated temperature and at a suitable flow rate so that a desired process condition, e.g., a constant thermal gradient, a uniform temperature (isothermal) condition, or an adiabatic condition, is continuously maintained in the vaporizer.

Accordingly, such thermal matching of the thermal damping fluid may be readily determined by simple calorimetric measurements or alternatively by test runs in the liquid delivery and vaporization system, for the liquid reagent and for the thermal damping fluid, to determine appropriate thermal damping fluid compositions, and process conditions therefor, without undue experimentation. These measurements may also be made dynamically during the operation of liquid reagent delivery and vaporization system with process temperature monitoring, e.g., vaporizer element temperature monitoring, and corresponding modulation of the input of the thermal damping fluid, to achieve the desired environmental thermal condition in the housing.

The apparatus and method of the present invention thus permit the liquid delivery vaporization system to be operated at a continuously "thermally ballasted" condition when the active liquid reagent supply is discontinued during process changeover, e.g., removal of the coated wafers from the CVD chamber, or during fluctuation in process flow rate of the liquid reagent during active processing, as "make-up" thermal input, or during cool-down of the vaporization chamber subsequent to active processing operations, with the thermally ballasting fluid serving as a purge fluid to remove residual material from the vaporizer housing which would otherwise serve to form deposits on the interior surfaces of the housing and vaporization element if allowed to remain in the vaporization chamber and to rapidly cool down to ambient temperature levels.

Figure 2:
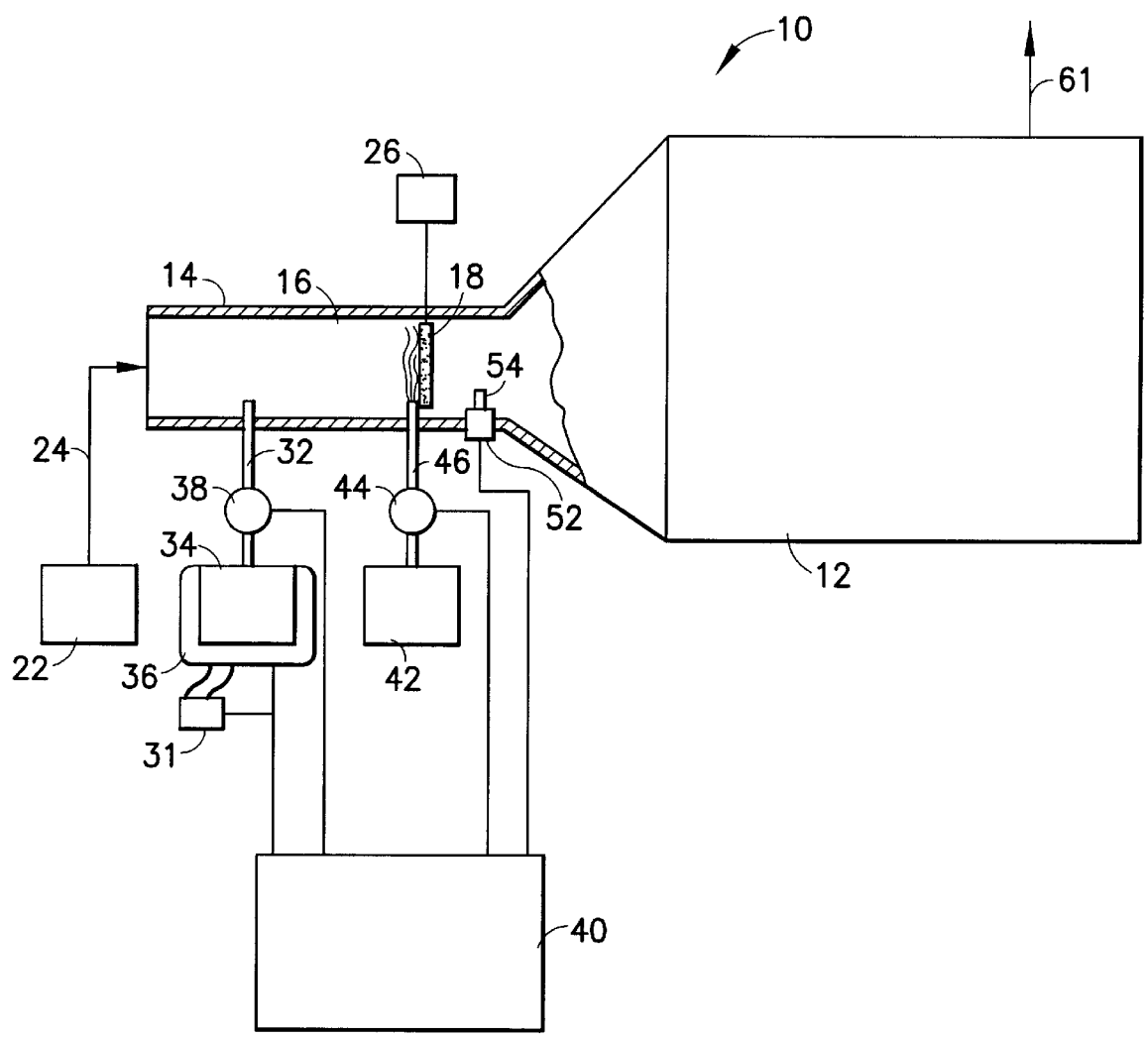
FIG. 2 is a schematic representation of a liquid reagent delivery system for vaporization of reagent liquid and transport of the resulting reagent vapor to a chemical vapor deposition chamber, with provision for "off-line" feeding of the thermal damping fluid to the liquid reagent delivery system, as regulated by a cycle time and temperature controller which monitors temperature variations within the chemical vapor deposition chamber.

Referring now to FIG. 2, there is shown a schematic representation of a liquid reagent delivery and vaporization system 10 according to another embodiment of the present invention, wherein the same system elements and components of FIG. 1 are shown correspondingly numbered in FIG. 2.

In the FIG. 2 embodiment, uniform thermal loading in the liquid reagent delivery and vaporization system 10 is regulated primarily by a cycle time and temperature controller 40. The cycle time and temperature controller 40 of FIG. 2 is linked to the thermocouple sensor 54 which monitors temperature inside flow passage 16. The thermocouple sensor is mounted in the wall of the housing by feedthrough 52.

Inert carrier gas flows from carrier gas source 22 through carrier gas line 24 into flow passage 16 of housing 14. The reagent reservoir 42 supplies liquid reagent to the vaporizer element at a rate determined by liquid reagent flow control valve 44 in liquid reagent feed line 46. The liquid reagent may constitute a solvent solution or suspension containing a solid-phase precursor compound or complex. For example, the liquid reagent may comprise metalorganic compounds in solvent solution. The vaporizer element 18 receives the liquid reagent from liquid reagent line 46. The liquid is rapidly vaporized as it contacts the porous sintered metal matrix of the vaporizer element 18.

The thermocouple sensor 54 is installed within the vaporization zone containing the vaporizer element 18. The thermocouple sensor monitors temperature fluctuations of the process fluids entering the CVD chamber 12 during the "on stream" and "off-stream" periods of operation. A baseline process fluid temperature is established for selected operating conditions including the flow of liquid reagent through flow control valve 44 to vaporizer element 18 via liquid reagent line 46. If a temperature increase in the vaporization zone is sensed by thermocouple sensor 54, cycle time and temperature controller 40 opens damping valve 38 releasing thermal damping fluid from line 32 into flow passage 16 to modulate the temperature to the desired level. The amount of thermal damping fluid to be dispensed into flow passage 16 is thereby regulated by the cycle time and temperature controller 40 and the thermocouple 54. Conversely, if a temperature decrease in the vaporization zone is sensed by the thermocouple 54, then the cycle time and temperature controller may act to increase the heating of the thermal damping fluid and to introduce the heated fluid into the vaporization zone to maintain the desired temperature condition therein. In such manner, the desired thermal conditions in the vaporization zone may be dynamically maintained during "on-line" operation of the system. Alternatively, the damping fluid flow control valve 38 may be arranged to be closed whenever liquid reagent is being dispensed to the vaporizer element 18 (i.e., whenever control valve 44 is open).

The damping fluid source vessel 34 is provided with a heater jacket 36 operatively coupled to power source 31 to enable cycle time and temperature controller 40 to manipulate the temperature of the thermal damping fluid entering flow passage 16 (e.g., by modulating the intensity of heating of the thermal damping fluid by the power source 31).

Although it is generally desirable to use a thermal damping fluid having comparable specific heat capacity, and (when the thermal damping fluid is a vaporizable liquid being vaporized on the vaporization element) comparable heat of vaporization and comparable vaporization temperature to that of the liquid reagent, responsive temperature control of the dispensed thermal damping fluid is advantageous when augmentation of the heating effect is desired, or when it is desired to blend in the thermal damping fluid to moderate temperature swings during the active "on-line" vaporization operation involving flow of the reagent liquid to the vaporizer element.

Cycle time and temperature controller 40 may as shown be linked to both thermocouple sensor 54 and heater jacket 36 as shown, as well as to power supply 31. Temperature control of source vessel 34 via power supply 31 and/or heater jacket 36 may thereby be employed to efficiently carry out the thermal damping process in the vaporization zone.

Figure 3:
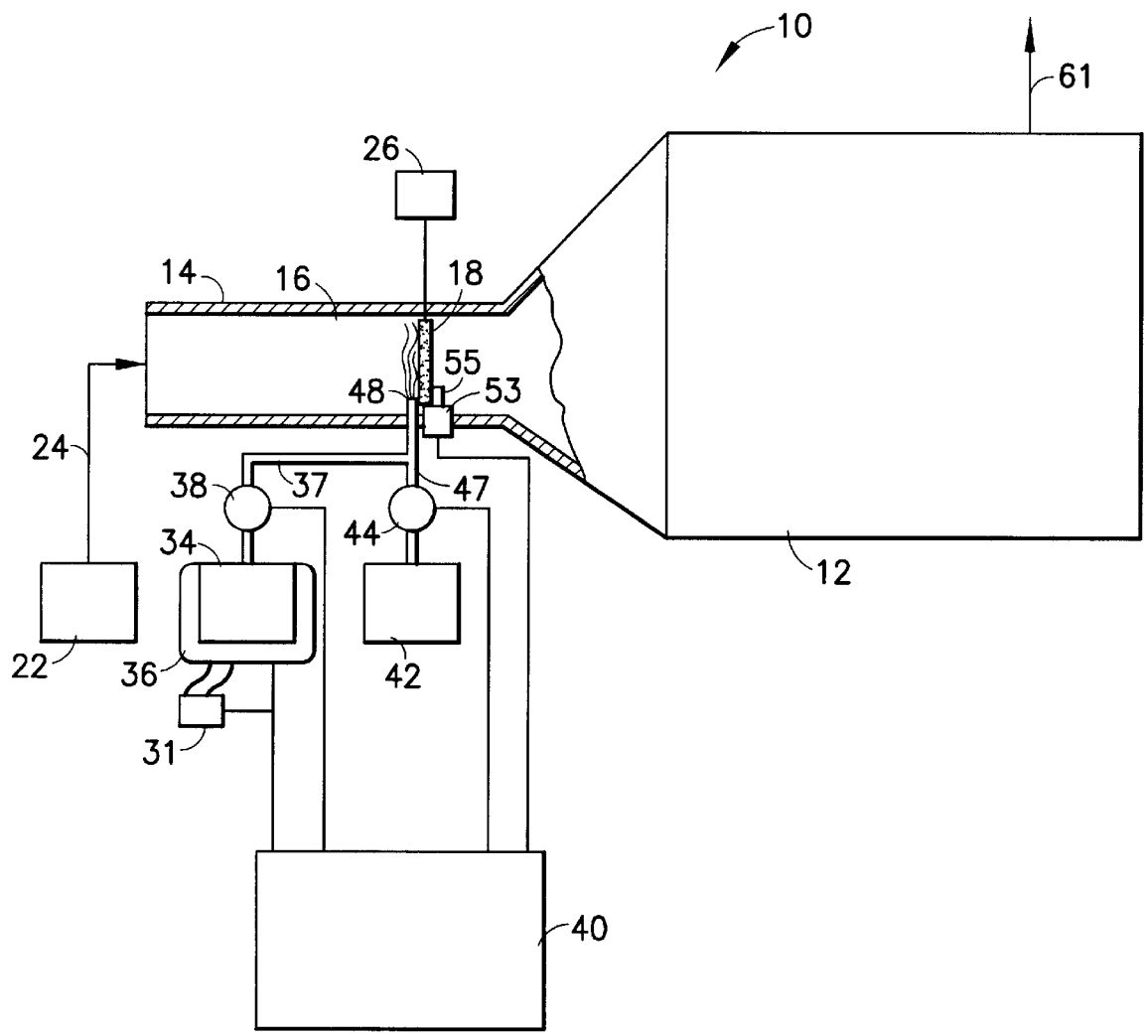
FIG. 3 is a schematic representation of a liquid reagent delivery system for vaporization of reagent liquid and transport of the resulting reagent vapor to a chemical vapor deposition chamber, and for feeding of a thermal damping fluid via a common delivery duct to a vaporizer element.

Referring to FIG. 3, another embodiment is shown in which the vaporization surface of vaporizer element 18 is directly monitored for temperature by thermocouple sensor 55 extending into the vaporization zone though the housing wall by means of the feedthrough 53. Such an arrangement allows cycle time and temperature controller 40 to register temperature readings and temperature fluctuations of the vaporizer element 18 and to responsively control the opening or closing of thermal damping fluid flow valve 38 when undesirable temperatures of the vaporizer element are registered. The temperature of source vessel 34 is regulated by heat jacket 36 which is operatively coupled to cycle time and temperature controller 40. Direct delivery of the damping fluid to the vaporizer element 18 is provided by damping fluid feed line 37 containing flow control valve 38 therein and joined at its extremity to reagent liquid feed line 47. Both the liquid reagent and thermal damping fluid are delivered to the vaporization surface of vaporizer element 18 through injection port 48 of feed line 47.

The advantages of the invention are more fully appreciated by the following examples showing temperature fluctuations of the vaporizer element or "frit" in a liquid delivery vaporizer unit when no damping fluid is used, during normal "on-line" operation of the liquid reagent delivery and vaporization system when reagent liquid is being vaporized for subsequent deposition of vapor component(s) on a substrate in a downstream CVD chamber.

EXAMPLE 1

Figure 4:
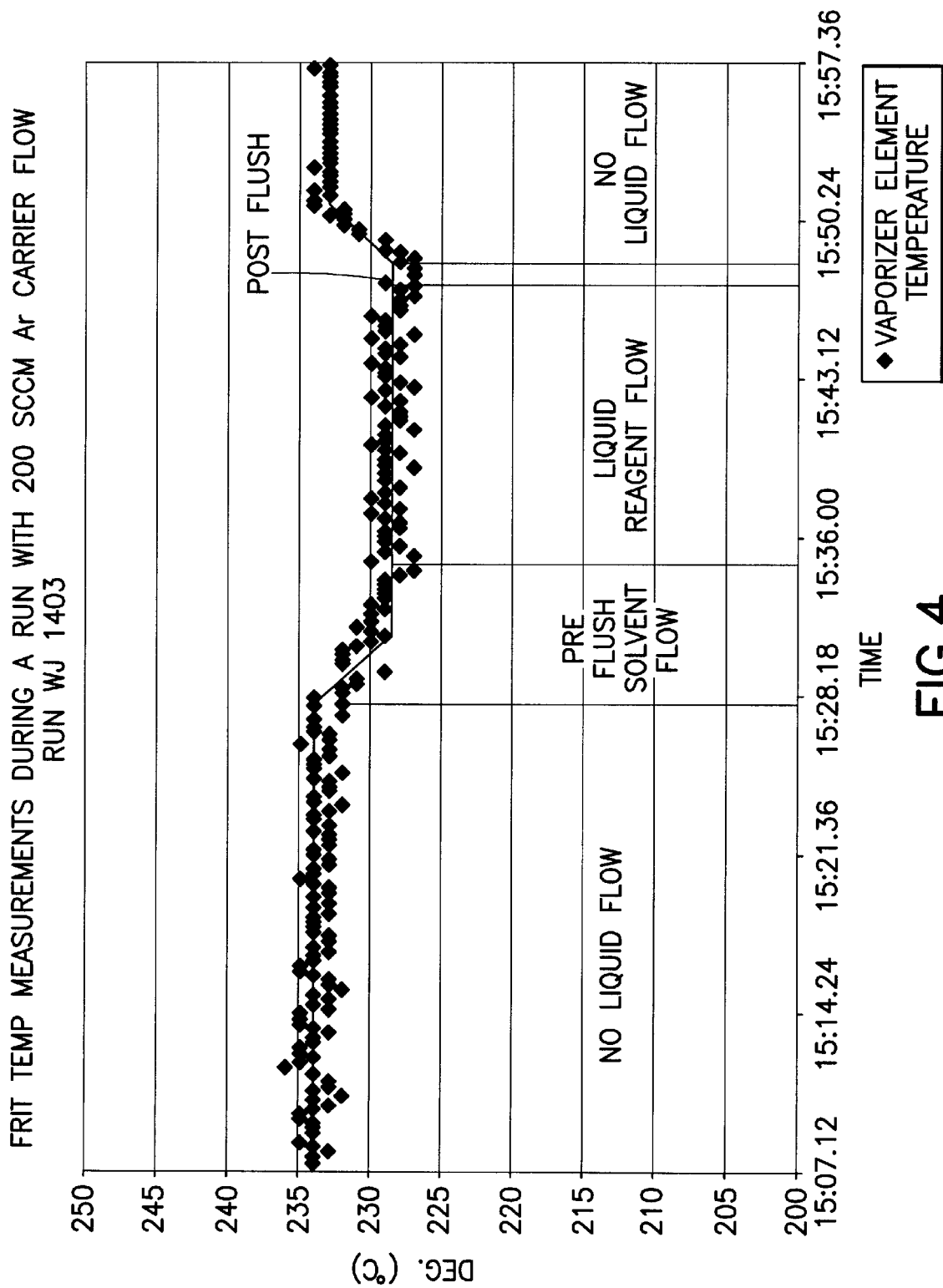
FIG. 4 is a graphic illustration of temperature fluctuations of a vaporizer element in a typical liquid delivery and vaporization system during normal "off" line and "on" line delivery of reagent liquid to the vaporizer element when no thermal damping fluid is being used.

FIG. 4 is a graph of temperature of a vaporizer element as a function of time during BST thin film growth in a representative CVD reactor. Five distinct time periods of operation are observed:

Time Period 1) No Liquid Flow

During this time period, the chamber was pumped down after loading a wafer. There is no liquid reagent flow to the vaporizer. Under these conditions the temperature of the heated surface of the vaporizer frit element was 234 degrees C.

Time Period 2) Pre-Flush Solvent Flow

During this time period the pre-flush solvent flow was initiated. The flow of solvent lowers the frit temperature to a new equilibrium value of 228 degrees C.

Time Period 3) Liquid Reagent Flow

During this time period, the reagent flow is started to the vaporizer frit element, and vapors were channeled first to bypass and then to the CVD chamber for film growth.

Time Period 4) Post Flush

This time period is representative of the period after film growth has occurred, when solvent was used to clear liquid reagent from the injection port and delivery tube.

Time Period 5) No Liquid Flow

During this time period, all flow of reagent to the vaporizer was stopped.

In the liquid delivery vaporization system whose thermal characteristics are shown in FIG. 4, thermal energy is required to vaporize the liquid reagent, which typically comprises a solvent carrier and dissolved precursor. The majority (90%) of the energy required, however, goes into heating and vaporizing the solvent carrier because the mass flow of solvent is an order of magnitude greater than that of the dissolved precursor. Wattage required to vaporize the liquid stream is typically on the order of 2 watts for flow rates on the order of 0.1 cc/min. This heat load reduces the temperature of the vaporizer element or frit as compared to the case with no liquid flow. Since the vaporizer element in this system comprises a vaporization frit element in the form of a porous disk which is only a moderate conductor of heat, the temperature drop takes a period of time to equilibrate, and the subsequently reached equilibrium temperature is considerably lower than the initial temperature before flow was initiated. This temperature change is shown in the pre flush area of the graph (Time Period 2).

It is desirable to maintain a constant vaporization temperature throughout the duration of operation of the system. Efficiencies of deposition of individual precursors in liquid reagent solution can be a strong function of temperature. In order to ensure the same composition throughout the deposited film, it is required that the vaporization temperature be kept constant during the on-line operation of the liquid delivery system involving vaporization of the liquid reagent. For this reason a "pre-flush" has been employed in the process system for which data is shown in FIG. 4. The pre-flush of only solvent establishes the temperature of the vaporization frit element at an equilibrium value. Empirically, this time in the system was determined to be on the order of 6 minutes. After the frit element is at thermal equilibrium, liquid reagent flow is initiated, and the temperature remains constant throughout the duration of the liquid reagent vaporization operation. Some scatter appears in the data in FIG. 4, due to noise introduced by the substrate heater power electronics.

EXAMPLE 2

Figure 5:
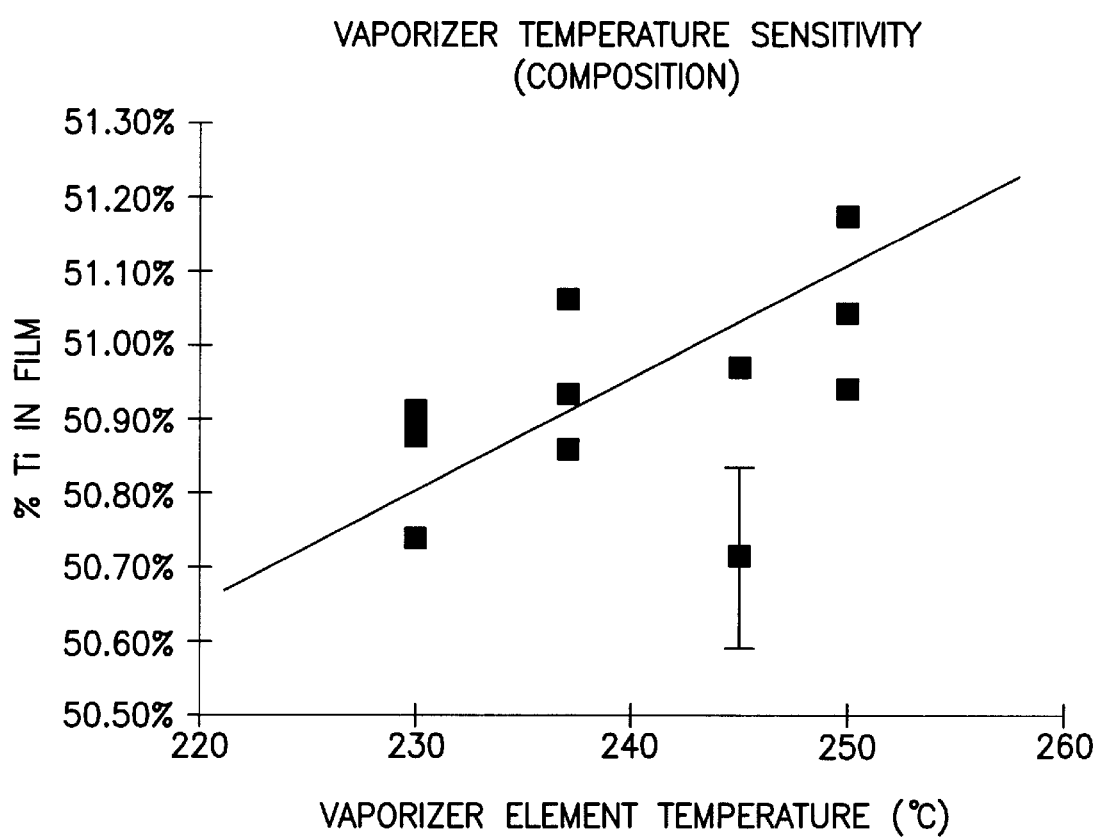
FIG. 5 is a graphic illustration of variation of titanium concentration in BST films formed with a liquid delivery chemical vapor delivery system, as a function of temperature of the vaporizer element.

FIG. 5 shows the percentage of titanium in a barium strontium titanate (BST) film produced by liquid delivery MOCVD as a function of vaporizer frit temperature. The data are plotted for twelve BST film depositions conducted at four different frit temperatures with all other process conditions being held constant. The liquid reagent delivery and vaporization system flow rate was held constant at a standard 0.07 cc/min and the deposition time was 400 seconds.

The graph of FIG. 5 shows the dependence of the film composition (as measured by titanium percentage of the BST film) as a function of vaporizer temperature. Each run reflected in the graph of FIG. 5 was conducted at a different vaporizer element temperature condition. As the vaporization element run temperature was increased from about 230 degrees Celsius to 250 degrees Celsius, the percentage of titanium in the BST film increased by fractions of one percentage point.

For example, at a temperature of 230° C., the titanium concentration in the film is about 50.8%, but at a temperature of 250° C., the titanium concentration in the film was above 51.1%. Even if the temperature rises only from about 230° C. to about 238° C., the Ti concentration changes from about 50.8% to about 50.9%.

It therefore is apparent that even small temperature variations during on-line processing can be detrimental to the objective of maintaining uniform composition during the reagent vaporization and deposition operation, and that moderate temperature swings during active processing of the liquid reagent can be severely detrimental to the homogeneity of the film composition.

While the invention has been described herein with reference to illustrative features, aspects and embodiments, it will be recognized that the invention may be widely varied, with respect to other features, aspects and embodiments. Accordingly, the invention is to be broadly construed, as encompassing within its spirit and scope, all such features, aspects and embodiments.

What is claimed is:

1. A liquid reagent delivery and vaporization system, comprising:

a housing defining a flow passage for flow of a process fluid therethrough;

a vaporizer element positioned within the housing and including a vaporization surface;

means for heating the vaporization surface of the vaporizer element;

a liquid reagent source arranged to selectively deliver a liquid reagent to the vaporization surface of the vaporizer element during heating thereof, so that the liquid reagent is vaporized to form a reagent vapor for flow through the flow passage;

wherein the system is constructed and arranged such that the housing and vaporizer element experience a time-varying thermal load during use thereof; and a thermal damping fluid source arranged to selectively deliver a thermal damping fluid into the flow passage for flow through the housing and contact with the vaporizer element so as to thermally damp the time-varying thermal load and maintain a predetermined thermal condition therein.

2. A system according to claim 1, wherein the system is constructed and arranged to selectively terminate delivery of liquid reagent to the vaporization surface and to contemporaneously selectively initiate delivery of the thermal damping fluid into the flow passage to maintain the predetermined thermal condition therein, wherein said predetermined thermal condition thermally matches vaporization conditions when the liquid reagent is vaporized for flow of reagent vapor through the flow passage.

3. A system according to claim 1, wherein the system is constructed and arranged to selectively initiate delivery of the thermal damping fluid into the flow passage during periods of non-delivery of liquid reagent to the vaporization surface of the vaporization element, in the course of continuous operation involving (i) said periods of non-delivery of liquid reagent to the vaporization surface of the vaporization element and (ii) periods of delivery of liquid reagent to the vaporization surface of the vaporization element.

4. A system according to claim 1, wherein the vaporization surface is heated by a heating modality selected from the group consisting of conductive heating, convective heating, radiation heating and electrical resistance heating.

5. A system according to claim 1, further comprising a cycle time controller arranged to controllably deliver the thermal damping fluid into the flow passage during periods of time when there is no flow of the reagent liquid to the vaporizer element.

6. A system according to claim 1, further comprising a controller arranged to monitor temperature in the flow passage and to responsively controllably deliver the thermal damping fluid into the flow passage to maintain the predetermined thermal condition.

7. A system according to claim 1, further comprising a heater operatively coupled with the source of thermal damping fluid, and arranged to selectively heat the thermal damping fluid as needed for delivery of the thermal damping fluid at a temperature maintaining the predetermined thermal condition.

8. A system according to claim 1, wherein the liquid reagent source comprises a liquid reagent vessel joined in closed liquid flow relationship with a liquid reagent feed line containing a liquid reagent flow control valve and arranged to discharge the liquid reagent onto the vaporization surface of the vaporizer element during heating thereof.

9. A system according to claim 1, wherein the thermal damping fluid source comprises a thermal damping fluid vessel joined in closed liquid flow relationship with a thermal damping fluid feed line containing a thermal damping fluid flow control valve and arranged to discharge the thermal damping fluid into the flow passage to maintain the predetermined thermal condition therein.

10. A system according to claim 1, wherein the liquid reagent source comprises a liquid reagent vessel joined in closed liquid flow relationship with a liquid reagent feed line containing a liquid reagent flow control valve and arranged to discharge the liquid reagent onto the vaporization surface of the vaporizer element during heating thereof;

the thermal damping fluid source comprises a thermal damping fluid vessel joined in closed liquid flow relationship with a thermal damping fluid feed line containing a thermal damping fluid flow control valve and arranged to discharge the thermal damping fluid into the flow passage to maintain the predetermined thermal condition therein;

further comprising:

a controller arranged to controllably open and close the liquid reagent flow control valve and the thermal damping fluid flow control valve, so that thermal damping fluid is delivered into the flow passage during periods of time when the reagent liquid is not being delivered to the vaporizer element.

11. A system according to claim 1, wherein the thermal damping fluid source is arranged to deliver thermal damping fluid to the vaporization surface of the vaporizer element for damping temperature fluctuations of the vaporization surface.

12. A system according to claim 10, wherein the controller comprises a microprocessor.

13. A system according to claim 10, wherein the controller comprises a central processing unit of a digital computer.

14. A liquid delivery chemical vapor deposition system, comprising:

a housing defining a flow passage for flow of a process fluid therethrough;

a vaporizer element positioned within the housing and including a vaporization surface;

means for heating the vaporization surface of the vaporizer element;

a liquid reagent source arranged to selectively deliver a liquid reagent to the vaporization surface of the vaporizer element during heating thereof, so that the liquid reagent is vaporized to form a reagent vapor for flow through the flow passage;

wherein the system is constructed and arranged such that the housing and vaporizer element experience a time-varying thermal load during use thereof;

a thermal damping fluid source arranged to selectively deliver a thermal damping fluid into the flow passage for flow through the housing and contact with the vaporizer element in sufficient quantity and at sufficient rate to thermally damp the time-varying thermal load and maintain a predetermined thermal condition therein; and a chemical vapor deposition reactor joined in reagent vapor-receiving relationship to said flow passage.

15. A liquid reagent delivery and vaporization process, comprising:

providing a housing defining a flow passage for flow of a process fluid therethrough, with a vaporizer element within the housing and including a vaporization surface;

heating the vaporization surface of the vaporizer element;

selectively delivering a liquid reagent to the vaporization surface of the vaporizer element during heating thereof, so that the liquid reagent is vaporized to form a reagent vapor;

flowing the reagent vapor through the flow passage;

wherein the housing and vaporizer element experience a time-varying thermal load during use thereof; and selectively delivering a thermal damping fluid into the flow passage for flow through the housing and contact with the vaporizer element so as to thermally damp the time-varying thermal load and maintain a predetermined thermal condition therein.

16. A process according to claim 15, comprising selectively terminating delivery of liquid reagent to the vaporization surface and to contemporaneously selectively initiating delivery of the thermal damping fluid into the flow passage to maintain the predetermined thermal condition therein, wherein said predetermined thermal condition thermally matches vaporization conditions when the liquid reagent is vaporized and reagent vapor is flowed through the flow passage.

17. A process according to claim 15, comprising selectively initiating delivery of the thermal damping fluid into the flow passage during vaporization of the reagent liquid, to maintain the predetermined thermal condition.

18. A process according to claim 15, comprising heating the vaporization surface by a heating modality selected from the group consisting of conductive heating, convective heating, radiation heating and electrical resistance heating.

19. A process according to claim 15, comprising delivering the thermal damping fluid into the flow passage during periods of time when the reagent liquid is not being vaporized.

20. A process according to claim 15, comprising monitoring temperature in the flow passage and responsively delivering the thermal damping fluid into the flow passage in sufficient amount and at sufficient rate to maintain the predetermined thermal condition.

21. A process according to claim 15, comprising selectively heating the thermal damping fluid as needed for delivery of the thermal damping fluid at a temperature maintaining the predetermined thermal condition.

22. A process according to claim 15, comprising delivering thermal damping fluid to the vaporization surface of the vaporizer element for damping temperature fluctuations of the vaporization surface.

23. A process according to claim 15, wherein the reagent liquid comprises a metalorganic composition.

24. A process according to claim 15, wherein the reagent liquid comprises a metalorganic composition in a solvent medium.

25. A process according to claim 15, wherein the reagent liquid comprises a precursor of a deposition component selected from the group consisting of Y, Ba, Cu, Bi, Sr, Ca, Pb, Zr, Ti, Ta, and Tl.

26. A process according to claim 15, further comprising flowing the reagent vapor from the flow passage to a deposition locus, and contacting the reagent vapor at the deposition locus with a substrate at sufficient temperature for deposition on the substrate of a thin film comprising a deposition component of the reagent vapor.

* * * * *

UNITED STATES PATENT AND TRADEMARK OFFICE
CERTIFICATE OF CORRECTION

PATENT NO.   : 6,099,653
DATED        : August 8, 2000
INVENTOR(S)  : Gautam Bhandari, Thomas H. Baum Page 1 of 1

It is certified that error appears in the above-identified patent and that said Letters Patent is hereby corrected as shown below:

Column 14,
Line 30, prior to "during" insert -- [during vaporization of the reagent liquid, to maintain the predetermined thermal condition] --

Signed and Sealed this

Twenty-fifth Day of September, 2001

*Attest:*

NICHOLAS P. GODICI
*Attesting Officer*   *Acting Director of the United States Patent and Trademark Office*